(12) United States Patent
Han

(10) Patent No.: US 8,080,825 B2
(45) Date of Patent: Dec. 20, 2011

(54) IMAGE SENSOR AND METHOD FOR MANUFACTURING THE SAME

(75) Inventor: Chang-Hun Han, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 214 days.

(21) Appl. No.: 12/344,438

(22) Filed: Dec. 26, 2008

(65) Prior Publication Data

US 2009/0166627 A1    Jul. 2, 2009

(30) Foreign Application Priority Data

Dec. 27, 2007   (KR) .................. 10-2007-0139371

(51) Int. Cl.
*H01L 31/02*      (2006.01)
*H01L 31/0376*    (2006.01)
*H01L 21/04*      (2006.01)

(52) U.S. Cl. ............ 257/53; 257/292; 257/E21.04; 257/E31.048; 257/E31.113; 438/96; 438/98

(58) Field of Classification Search .......... 257/53, 257/292, E31.113, E31.048, E21.04, E21.09, 257/E31.047, E31.001; 438/96, 98
See application file for complete search history.

(56) References Cited

U.S. PATENT DOCUMENTS

| 6,791,130 B2 | 9/2004 | Chao et al. | |
| 2004/0041224 A1* | 3/2004 | Chao et al. | 257/444 |
| 2009/0173940 A1* | 7/2009 | Hwang | 257/53 |

* cited by examiner

*Primary Examiner* — Victor A Mandala
*Assistant Examiner* — Whitney T Moore
(74) *Attorney, Agent, or Firm* — Sherr & Vaughn, PLLC

(57) ABSTRACT

An image sensor may include a first substrate having circuitry including wires and a silicon layer formed on and/or over the first substrate to selectively contact the wires. The image sensor may include photodiodes bonded to the first substrate while contacting the silicon layer and electrically connected to the wires. Each unit pixel may be implemented having complicated circuitry without a reduction in photosensitivity. Additional on-chip circuitry may also be implanted in the design.

18 Claims, 4 Drawing Sheets

IMAGE SENSOR AND METHOD FOR MANUFACTURING THE SAME

Figure 1:
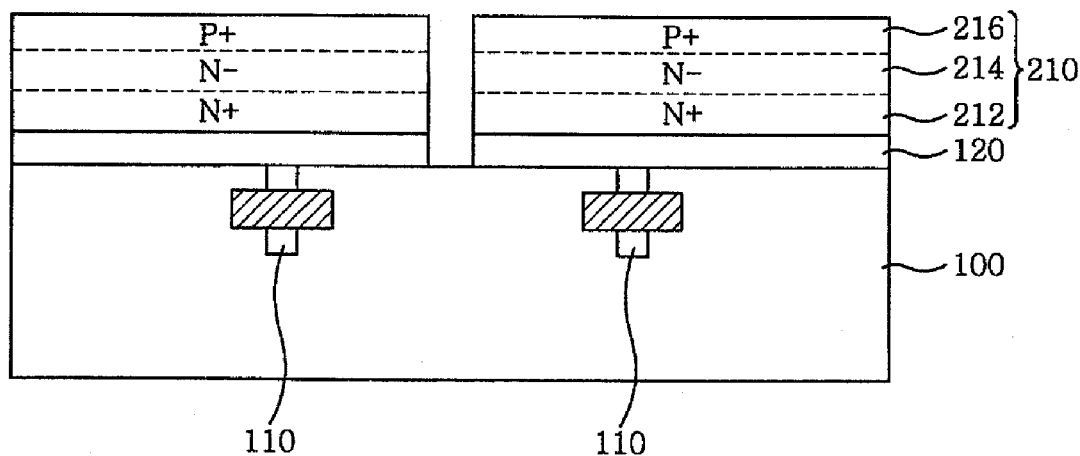
Figure 2:
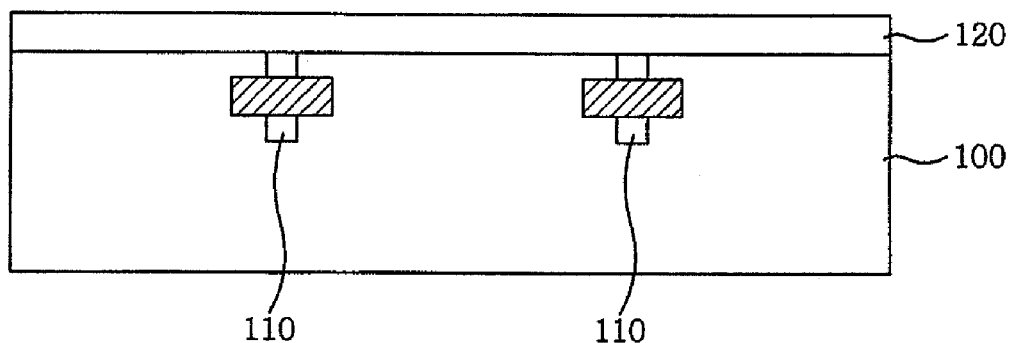

The present application claims priority under 35 U.S.C. 119 to Korean Patent Application No. 10-2007-0139371 (filed on Dec. 27, 2007), which is hereby incorporated by reference in its entirety.

BACKGROUND

An image sensor may be a semiconductor device that converts optical images into electrical signals. Image sensors may be largely classified as a charge coupled device (CCD) image sensor or a CMOS (Complementary Metal Oxide Silicon) image sensor (CIS).

A CMOS image sensor may have photodiodes and MOS transistors formed in unit pixels, which may sequentially detect electrical signals of each unit pixel by a switching method. This may result in realizing an image. A CMOS image sensor may have a structure in which photodiodes may be arranged horizontally with transistors. Even though some lateral CMOS image sensors may overcome certain limitations of CCD image sensors, they may still have various disadvantages. For example, in a lateral CMOS image sensor, a photodiode and a transistor may be fabricated next to each other on and/or over a substrate. Thus, additional area may be required for the photodiode. This may reduce a fill factor area and may also limit a resolution. In addition, it may be difficult to optimize a process technology for preparing both the transistor and the photodiode at the same time. For example, a fast transistor process may require a shallow junction for low sheet resistance, but such a shallow junction may be unsuitable for a photodiode process. Moreover, according to a lateral CMOS image sensor, additional on-chip functions may be added to an image sensor. Hence, either a pixel size may need to be increased to maintain a sensitivity of the image sensor, or an area required for a photodiode may need to be decreased to maintain a pixel size. However, if a pixel size increases, a resolution of the image sensor may decrease, and if a photodiode area decreases, a sensitivity of the image sensor may decrease.

SUMMARY

Embodiments relate to an image sensor and a method for manufacturing the same. Embodiments relate to an image sensor, which may provide a new integration of circuitry and photodiodes, and a method for manufacturing the same. Embodiments relate to an image sensor, which may use vertical photodiodes and may prevent defects in photodiodes, and a method for manufacturing the same.

Embodiments relate to an image sensor, which may improve both resolution and sensitivity, and a method for manufacturing the same. Embodiments relate to an image sensor, which may use vertical photodiodes and which may maximize a physical and electrical contact force between photodiodes and circuitry, and a method for manufacturing the same.

According to embodiments, an image sensor, may include at least one of the following. A first substrate on which circuitry, including wires, may be formed. A silicon layer formed on and/or over the first substrate so as to selectively contact with the wires. Photodiodes bonded to the first substrate while contacting with the silicon layer, and electrically connected to the wires.

According to embodiments, a method for manufacturing an image sensor may include at least one of the following. Preparing a first substrate on which circuitry, including wires, may be formed. Forming a silicon layer on and/or over the first substrate so as to selectively contact the wires. Preparing a second substrate on and/or over which photodiodes may be formed. Bonding the first substrate and the second substrate so that the photodiodes and the silicon layer may come into contact with each other. Exposing the photodiodes by removing a bottom side of the bonded second substrate.

DRAWINGS

Example FIG. 1 is a cross-sectional view illustrating an image sensor in accordance with embodiments.

Example FIGS. 2-8 are process cross-sectional views illustrating a method for manufacturing an image sensor in accordance with embodiments.

DESCRIPTION

Example FIG. 1 is a cross-sectional view illustrating an image sensor in accordance with embodiments. Referring to Example FIG. 1, an image sensor may include first substrate 100 where circuitry, including wires 110, may be formed. In accordance with embodiments, an image sensor may further include silicon layer 120 formed on and/or over first substrate 100, which may selectively contact wires 110. It may also include photodiodes 210, which may be bonded to first substrate 100 while contacting silicon layer 120, and may be electrically connected to wires 110. Silicon layer 120 may be one of an amorphous layer, a polysilicon layer, and a monocrystalline silicon layer. Vertical photodiodes may be used, and a silicon layer having a high bonding force with photodiodes 210 may be interposed between photodiodes 210 and the circuitry. This may improve physical and electrical contact force between photodiodes 210 and the circuitry. If a crystalline semiconductor layer on and/or over which photodiodes 210 may be formed is a silicon crystal, and silicon layer 120 is one of an amorphous silicon layer, a polysilicon layer, and a monocrystalline silicon layer, a bonding force of first substrate 100 and second substrate 200 (shown in example FIG. 3) may be increased by Si—Si bonding. Silicon layer 120 may be formed to have a thickness in a range between approximately 100 Å to 1,000 Å, and may therefore serve as a bonding layer of first substrate 100 and second substrate 200. Crystalline semiconductor layer 210a (shown in example FIG. 3) may be a monocrystalline semiconductor layer, but may not be limited thereto. Crystalline semiconductor layer 210a may be a multi-crystalline semiconductor layer.

In accordance with embodiments, electric circuitry of first substrate 100 for a CIS may include four transistors (4 Tr CIS). Circuitry of first substrate 100 for a CIS may include 1 Tr CIS, 3 Tr CIS, 5 Tr CIS, or 1.5 Tr CIS (CIS sharing transistors). Wires 110 formed on and/or over first substrate 100 may include metals and plugs. An uppermost portion of wires 110 may serve as lower electrodes of photodiodes 210. Photodiodes 210 may include first conductivity type conduction layer 214, which may be formed within crystalline semiconductor layer 210a (shown in example FIG. 4) and second conductivity type conduction layer 216, which may be formed within crystalline semiconductor layer 210a on and/or over first conductivity type conduction layer 214. Photodiodes 210 may include lightly-doped N-type conduction layer 214, which may be formed within crystalline semiconductor layer 210a and may include heavily-doped N-type conduction layer 216, which may be formed within crystalline semiconductor layer 210a on and/or over lightly-doped N type conductor layer 214. Other configurations could be used, according to embodiments. For example, the first conductivity type is not limited to the N-type but may be a P-type.

Heavily-doped first conductivity type conduction layer 212 may be formed under and/or below first conductivity type conduction layer 214. For example, heavily-doped first conductivity type conduction layer 212 may be formed of an N+ layer and may enhance an ohmic contact. A top metal may be formed on and/or over photodiodes 210, and a color filter may also be formed on and/or over photodiodes 210. According to embodiments, photodiodes 210 may be separated by an insulation layer for each pixel.

Example FIGS. 2-8 are process cross-sectional views illustrating a method for manufacturing an image sensor, according to embodiments. Referring to example FIG. 2, first substrate 100 may be formed, and may include wires 110. The circuitry of a CIS may include four transistors (4 Tr CIS). Alternatively, circuitry may include 1 Tr CIS, 3 Tr CIS, 5 Tr CIS, or 1.5 Tr CIS (CIS sharing transistors). Wires 110 formed on and/or over first substrate 100 may include metals and plugs. Silicon layer 120 may be formed on and/or over first substrate 100, and may selectively contact wires 110. Silicon layer 120 may be one of an amorphous layer, a polysilicon layer, and a monocrystalline silicon layer. Vertical photodiodes may be used, and silicon layer 120, which may have a high bonding force with photodiodes 210, may be interposed between photodiodes 210 and the circuitry. This may maximize physical and electrical contact force between photodiodes 210 and the circuitry.

If a crystalline semiconductor layer on and/or over which photodiodes 210 may be formed is a silicon crystal, and silicon layer 120 is one of an amorphous silicon layer, a polysilicon layer, and a monocrystalline silicon layer, a bonding force of first substrate 100 and second substrate 200 may be increased by Si—Si bonding. Silicon layer 120 may be formed to have a thickness in a range between approximately 100 Å to 1,000 Å. Silicon layer 120 may thus be beneficial as a bonding layer of first substrate 100 and second substrate 200.

Figure 3:
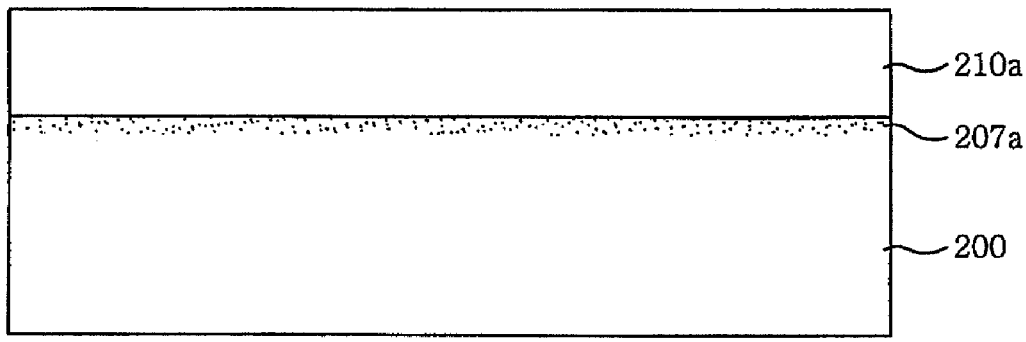

Referring to example FIG. 3, crystalline semiconductor layer 210a may be formed on and/or over second substrate 200. By having photodiodes 210 formed on and/or over crystalline semiconductor layer 210a, defects in photodiodes 210 may be prevented. Crystalline semiconductor layer 210a may be formed on and/or over second substrate 200 by epitaxial growth. Hydrogen ions may then be implanted into an interface between second substrate 200 and crystalline semiconductor layer 210a. This may form hydrogen ion implantation layer 207a.

Figure 4:
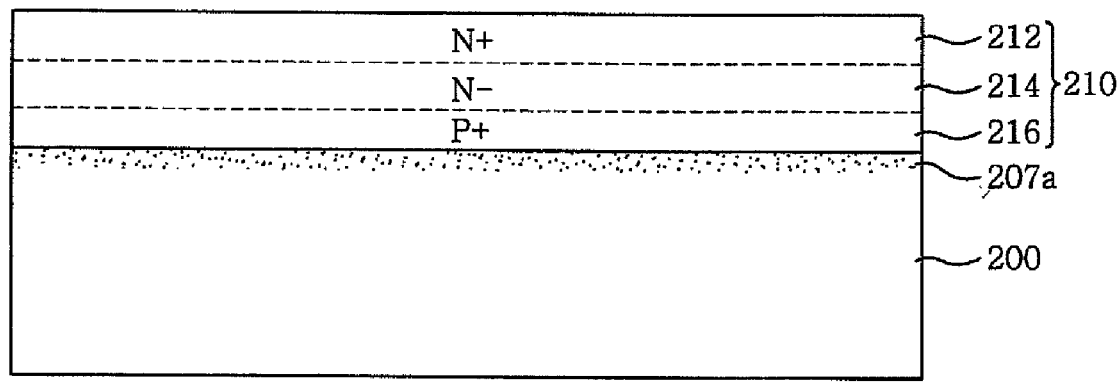

Referring to example FIG. 4, photodiodes 210 may be formed by ion implantation into crystalline semiconductor layer 210a. Second conductivity type conduction layer 216 may be formed at a lower part of crystalline semiconductor layer 210a. For example, heavily-doped P-type conduction layer 216 may be formed at a lower part of crystalline semiconductor layer 210a by implanting ions into a surface, for example the entire surface, of second substrate 200 by blanket implantation without using a mask. According to embodiments, second conductivity type conduction layer 216 may be formed with a junction depth of less than approximately 0.5 μm. First conductivity type conduction layer 214 may be on and/or over second conductivity type conduction layer 216. For example, lightly-doped N-type conduction layer 214 may be formed on and/or over second conductivity type conduction layer 216 by implanting ions into a surface, for example the entire surface, of second substrate 200 by blanket implantation without using a mask. First conductivity type conduction layer 214 may be formed with a junction depth of less than approximately 1.0 to 2.0μm. Heavily-doped first conductivity type conduction layer 212 may be formed on and/or over an upper side of first conductivity type conduction layer 214. Heavily-doped first conductivity type conduction layer 212 may be formed of an N+ layer, and may enhance an ohmic contact.

Figure 5:
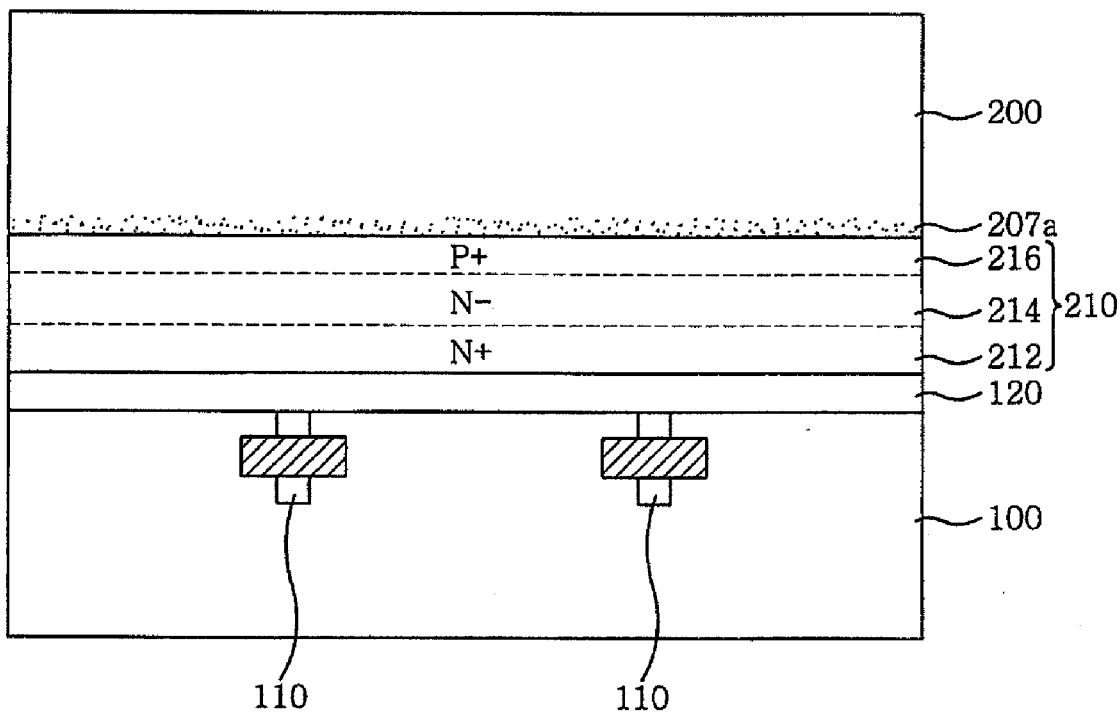
Figure 6:
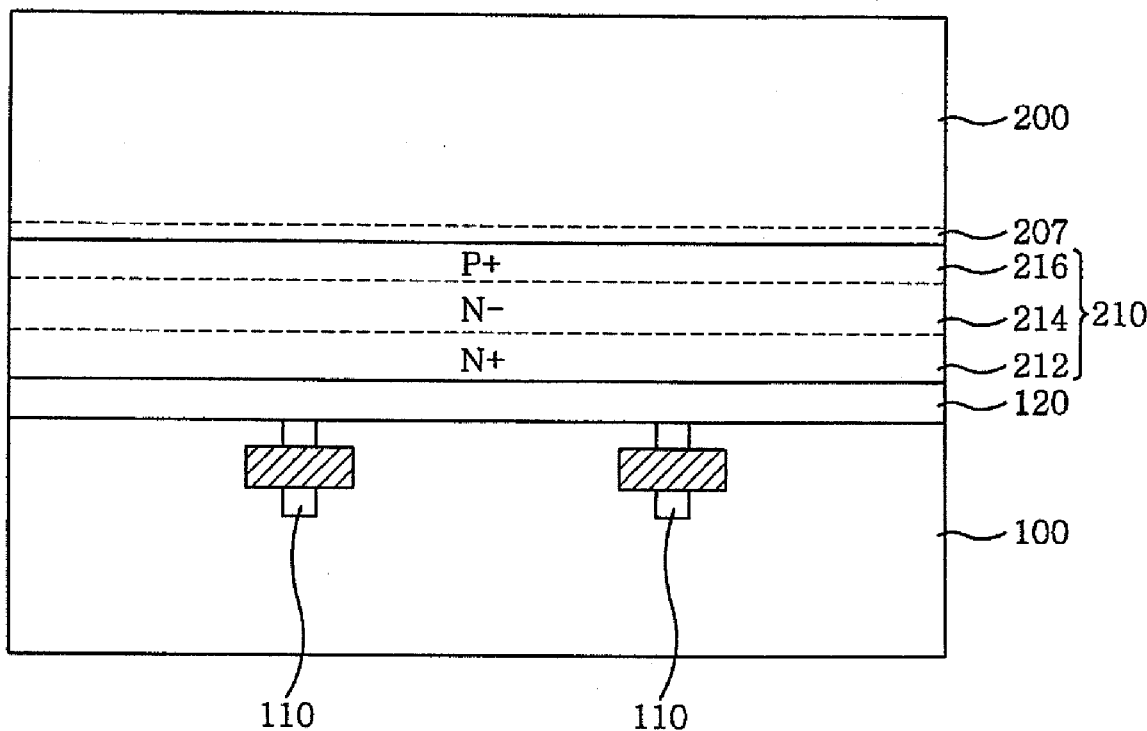
Figure 7:
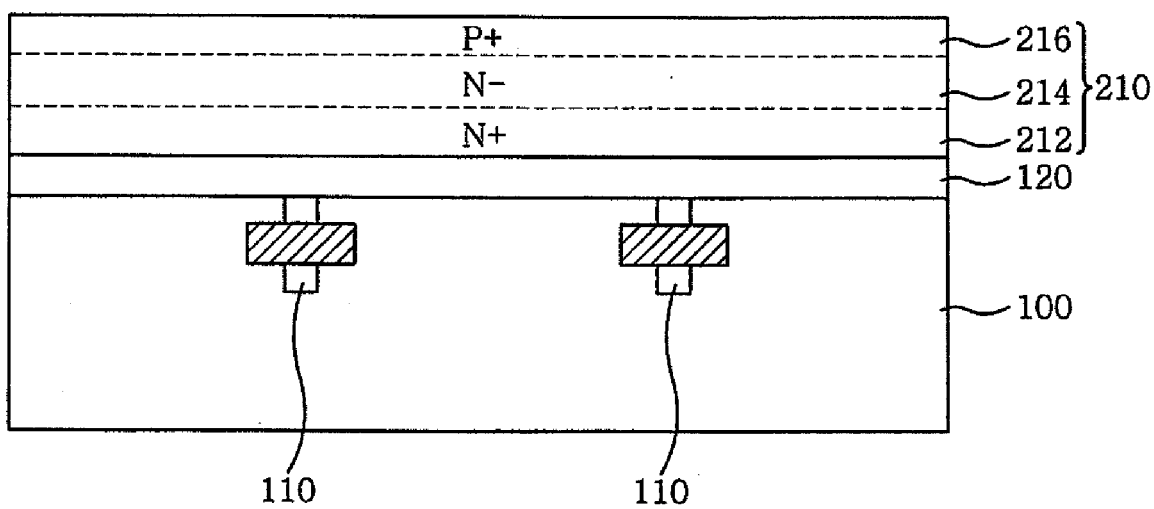

Referring to example FIG. 5, first substrate 100 and second substrate 200 may be bonded to each other and photodiodes 210 and silicon layer 120 may come into contact with each other. A surface energy of a surface bonded by plasma activation may be increased before bonding first substrate 100 and second substrate 200. Referring to example FIG. 6, hydrogen ion implantation layer 207a may be changed into hydrogen gas layer 207 by conducting thermal treatment on and/or over second substrate 200. Referring to example FIG. 7, photodiodes 210 may be exposed by removing a bottom side of second substrate 200, based on hydrogen gas layer 207.

Figure 8:
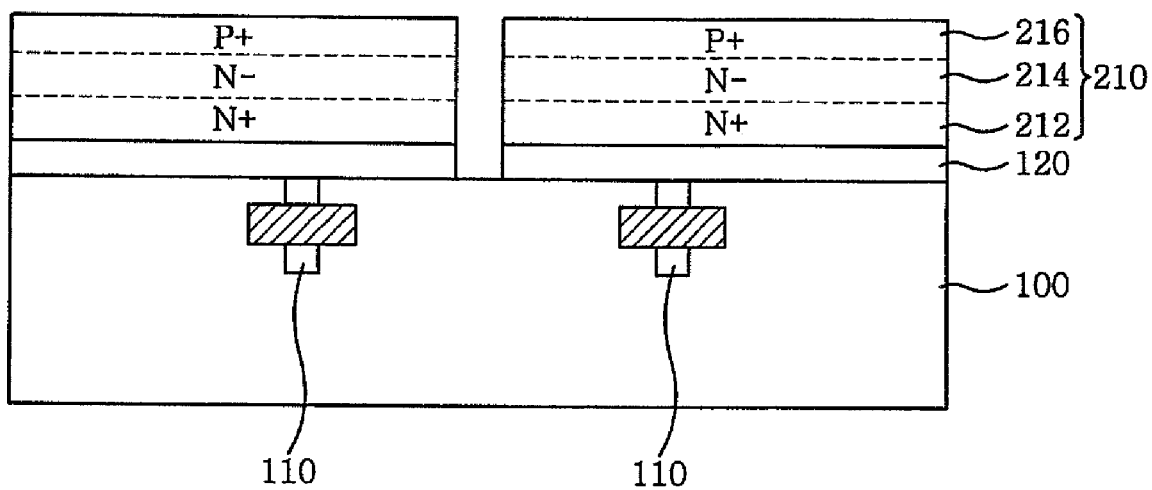

Referring to example FIG. 8, etching, which may separate photodiodes 210 from each other, may be carried out for each pixel. According to embodiments, etched portions may be filled with an insulation layer. According to embodiments, process steps to form an upper electrode, a color filter, and/or other features may be carried out.

In accordance with embodiments, vertical integration of circuitry and photodiodes may be provided. Physical and electrical contact force between photodiodes and the circuitry may be improved by using vertical photodiodes and interposing a silicon layer between the photodiodes and the circuitry. Defects in the photodiodes may be prevented by using vertical photodiodes, which may be located on and/or over an upper side of the circuitry, and by forming the photodiodes in a crystalline semiconductor layer. Moreover, physical and electrical contact force between photodiodes and the circuitry may be improved by using vertical photodiodes and interposing one of a crystalline layer and an amorphous layer having substantially the same elements as the photodiodes between the photodiodes and the circuitry. Accordingly, it is possible to prevent defects in the photodiodes by using vertical photodiodes, which may be located on and/or over an upper side of the circuitry, and by forming photodiodes in a crystalline semiconductor layer.

A fill factor may also be maximized in providing a fill factor close to 100% due to vertical integration of the circuitry and the photodiodes. Photosensitivity may be maximized using substantially a same pixel size as used in other image sensors by implementing vertical integration. Accordingly, a reduction in process costs while maintaining substantially the same resolution as provided by other devices. Each unit pixel may also implement more complicated circuitry without reducing sensitivity. Additional on-chip circuitry may also be integrated, which may increase performance of an image sensor and minimize a size of devices while reducing manufacturing costs. Embodiments may not limited to a CMOS image sensor. According to embodiments, any image sensor requiring photodiodes, including a CCD image sensor, may be used.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A device comprising:
a first substrate having circuitry including wires formed therein;
a silicon layer formed over the first substrate to selectively contact the wires; and
at least one photodiode bonded to the first substrate and in contact with the silicon layer and electrically connected to the wires,
wherein the at least one photodiode comprises a first conductivity type conduction layer formed within a crystalline semiconductor layer and a second conductivity type conduction layer formed over the first conductivity type conduction layer.

2. The device of claim 1, wherein the silicon layer comprises an amorphous silicon layer.

3. The device of claim 1, wherein the silicon layer comprises a polysilicon layer.

4. The device of claim 1, wherein the silicon layer comprises a monocrystalline silicon layer.

5. The device of claim 1, wherein the silicon layer has a thickness in a range between approximately 100 Å to 1000 Å.

6. The device of claim 1, wherein the first conductivity type conduction layer has a junction depth in a range between approximately 1.0 μm to 2.0 μm.

7. The device of claim 1, wherein the second conductivity type conduction layer has a junction depth of less than approximately 0.5 μm.

8. The device of claim 1, wherein the circuitry comprises one of a four transistor CMOS image sensor (4 Tr CIS), a one transistor CMOS image sensor (1 Tr CIS), a three transistor CMOS image sensor (3 Tr CIS), a five transistor CMOS image sensor (5 Tr CIS), and a shared transistor CMOS image sensor (1.5 Tr CIS).

9. The device of claim 1, wherein the at least one photodiode comprises vertically configured photodiodes.

10. The device of claim 1, wherein:
circuitry including the wires is formed in the first substrate;
the silicon layer is formed over the first substrate to selectively contact the wires;
a second substrate is prepared over the silicon layer;
the at least one photodiode is formed over the second substrate;
the first substrate and the second substrate are bonded so that the at least one photodiode and the silicon layer contact each other; and
the at least one photodiode is exposed by removing a bottom side of the bonded second substrate.

11. The device of claim 10, wherein the silicon layer comprises an amorphous silicon layer.

12. The device of claim 10, wherein the silicon layer comprises a polysilicon layer.

13. The device of claim 10, wherein the silicon layer comprises a monocrystalline silicon layer.

14. The device of claim 10, wherein the silicon layer is formed to have a thickness in a range between approximately 100 Å to 1000 Å.

15. The device of claim 10, wherein the first conductivity type conduction layer is formed to have a junction depth in a range between approximately 1.0 μm to 2.0 μm.

16. The device of claim 10, wherein the second conductivity type conduction layer is formed to have a junction depth of less than approximately 0.5 μm.

17. The device of claim 10, wherein the circuitry is formed to comprise one of a four transistor CMOS image sensor (4 Tr CIS), a one transistor CMOS image sensor (1 Tr CIS), a three transistor CMOS image sensor (3 Tr CIS), a five transistor CMOS image sensor (5 Tr CIS), and a shared transistor CMOS image sensor (1.5 Tr CIS).

18. The device of claim 10, wherein the at least one photodiode is formed in a vertical configuration.

* * * * *